(12) United States Patent
Park

(10) Patent No.: US 6,960,520 B2
(45) Date of Patent: Nov. 1, 2005

(54) METHOD FOR FORMING METAL LINES IN A SEMICONDUCTOR DEVICE

(75) Inventor: Cheolsoo Park, Seoul (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 178 days.

(21) Appl. No.: 10/749,485

(22) Filed: Dec. 30, 2003

(65) Prior Publication Data

US 2004/0219776 A1 Nov. 4, 2004

(30) Foreign Application Priority Data

Dec. 30, 2002 (KR) ................................ 10-2002-0086401

(51) Int. Cl.[7] .......................................... H01L 21/4763
(52) U.S. Cl. ................. 438/622; 438/622; 438/627; 438/629; 438/634; 438/637; 438/672; 438/675
(58) Field of Search ................. 438/622–625, 438/634, 637–640, 672, 675, 628–629, 643–644

(56) References Cited

U.S. PATENT DOCUMENTS 5,981,377 A  * 11/1999 Koyama .................... 438/633
6,130,102 A     10/2000 White, Jr. et al.
6,159,820 A  * 12/2000 Park ........................... 438/396
6,359,329 B1 *  3/2002 Kikuta ....................... 257/622
6,448,649 B1    9/2002 Lee et al.

* cited by examiner

Primary Examiner—Thanh Nguyen
(74) Attorney, Agent, or Firm—Henley, Flight & Zimmerman, LLC

(57) ABSTRACT

A method for forming metal lines in a semiconductor device is disclosed. An example method forms first metal lines and a first insulation layer on the first metal lines, etches the first insulation layer to expose the first metal lines, and deposits a conductive material into the etched portion of the first insulation layer to form contact plugs. The example method also forms a second insulation layer on the resultant structure, etches the second insulation layer to expose the contact plugs, deposits a material for cores into the etched portions of the second insulation layer to form the cores, and selectively removes the second insulation layer to expose the cores. In addition, the example method deposits second metal lines on both sides of the cores to branch current to both sides of the cores.

4 Claims, 3 Drawing Sheets

METHOD FOR FORMING METAL LINES IN A SEMICONDUCTOR DEVICE

FIELD OF THE DISCLOSURE

The present disclosure relates generally to semiconductor devices and, more particularly, to a method for forming metal lines in a semiconductor device.

BACKGROUND

In general, as semiconductor devices become more highly integrated, the importance of metal lines increases. Specifically, in a logic design technique as well as a memory design technique, the use of a back end of line ("BEOL") process becomes greater than that of a front end of line ("FEOL") process. This trend has caused a decrease in the operating speeds of semiconductor devices due to increases in resistance and parasitic capacitance upon formation of the metal lines.

For example, U.S. Pat. No. 6,448,649 discloses a method of forming plugs of two layers by deposition of a material for the plugs into holes and U.S. Pat. No. 6,130,102 discloses a method of forming plug of a dual damascene type to prevent a leakage current in a capacitor. However, such conventional methods cause structural problems and result in a high manufacturing cost of the semiconductor device.

DETAILED DESCRIPTION

As described in greater detail below, an example method for forming metal lines in a semiconductor device, includes forming first metal lines and a first insulation layer on the first metal lines, etching the first insulation layer until the first metal lines are exposed, depositing a conductive material into the etched portion of the first insulation layer to form contact plugs, forming a second insulation layer on the resultant structure, etching the second insulation layer to expose the contact plugs, depositing a material for cores into the etched portions of the second insulation layer to form the cores. In addition, the example method may further include selectively removing the second insulation layer to expose the cores, and depositing a second metal lines on both sides of the cores to branch current to both sides of the cores.

Figure 1A:
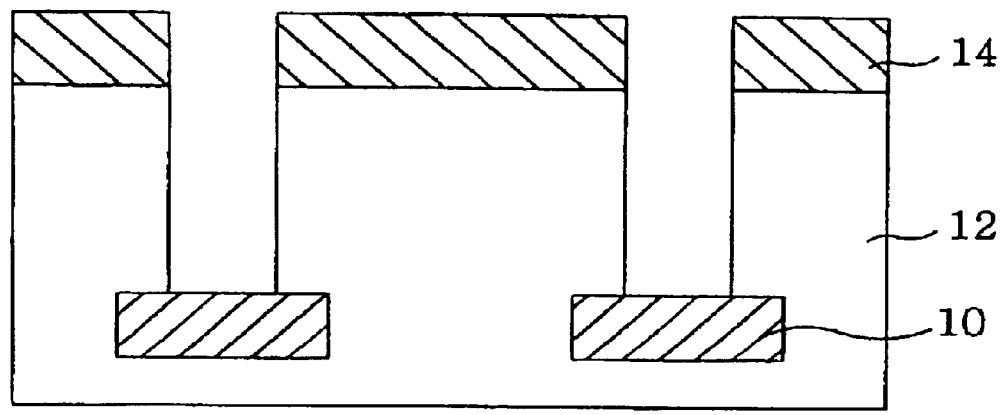
FIGS. 1A to 1F illustrate cross sectional views sequentially showing an example process of forming metal lines in a semiconductor device.

Referring to FIG. 1A, first metal lines 10 are formed on a semiconductor substrate and a first insulation layer 12 is formed thereon. The first insulation layer 12 is then planarized. A first photoresist pattern 14 for forming contact plugs is formed on the first insulation layer 12 and the first insulation layer 12 is etched by a dry etching process to expose the first metal lines 10.

Figure 1B:
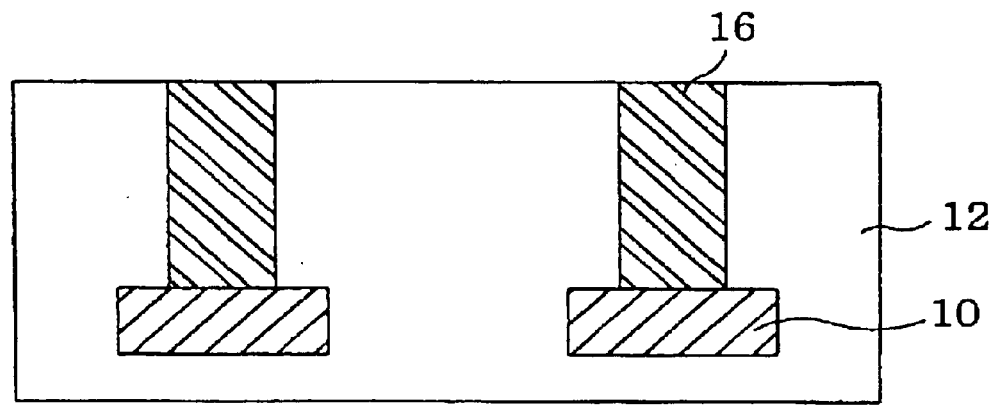

As shown in FIG. 1B, after the first photoresist pattern 14 is removed, a conductive material is deposited into the etched portion of the first insulation layer 12 to form the contact plugs 16.

Figure 1C:
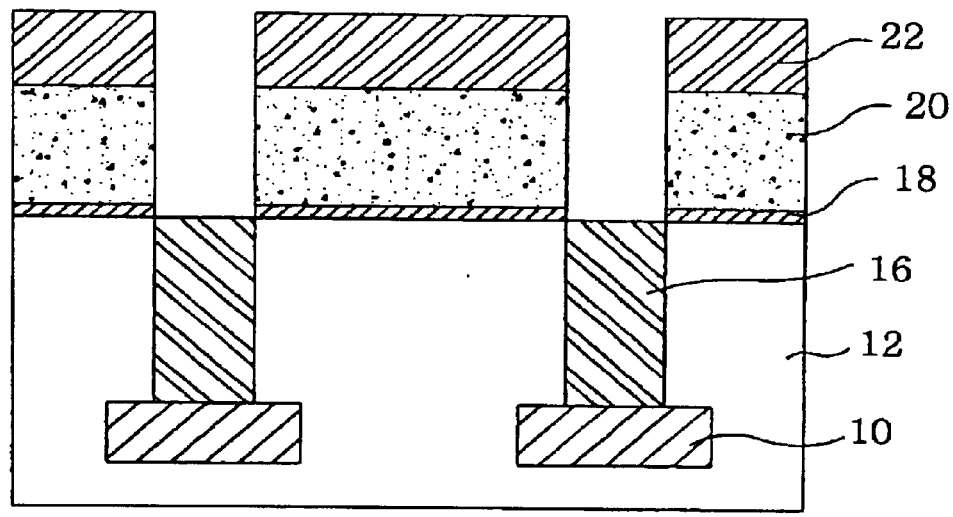

Subsequently, referring to FIG. 1C, an etch-stop nitride layer 18 and a second insulation layer 20 are deposited on the resultant structure, sequentially. A second photoresist pattern 22 for forming cores is then formed on the second insulation layer 20. The second insulation layer 20 and the etch-stop nitride layer 18 are in turn etched using the second photoresist pattern 22 as a mask, thereby exposing the top surface of the contact plugs 16.

Figure 1D:
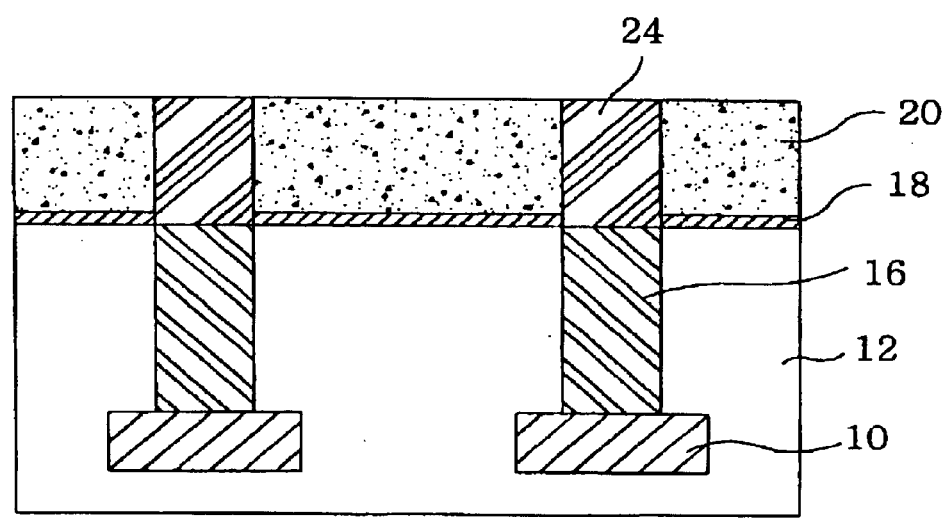

Referring to FIG. 1D, the second photoresist pattern 22 is removed and a material for the cores 24 is deposited into the etched portions of the second insulation layer 20 to form the cores 24. The material for the cores 24 is preferably TaN or TiN.

Figure 1E:
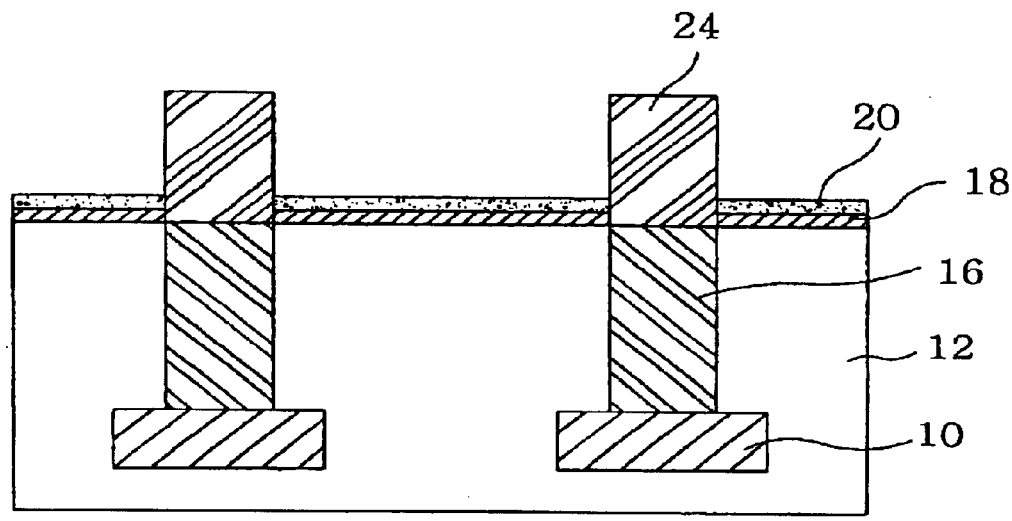

As shown in FIG. 1E, the cores 24 are exposed by selectively dry etching the second insulation layer 20, wherein the second insulation layer 20 is not entirely removed and remains with a small thickness.

Figure 1F:
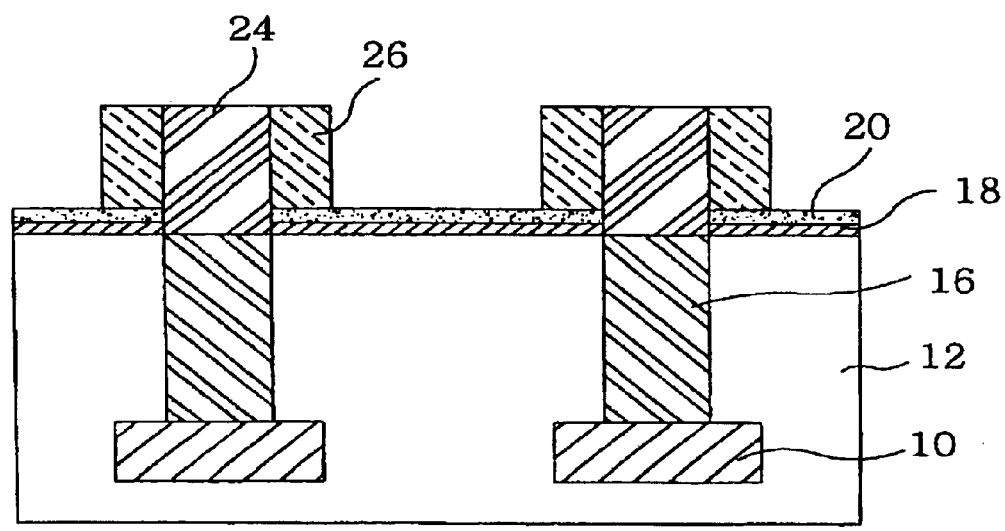

FIG. 1F provides a cross sectional view showing a state after second metal lines 26 are formed on the exposed cores 24 by a blanket etchback process. Specifically, the second metal lines 26 are formed on both sides of the cores 24 by the blanket etchback process, so that current is branched to the both sides of the cores 24. Further, by controlling a height of the cores, a resistance of the metal lines may be decreased.

With the example apparatus and methods described herein, an electromigration ("EM") characteristic of the metal lines is improved and a manufacturing cost of the semiconductor device is decreased.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method for forming metal lines in a semiconductor device, comprising:

forming first metal lines and a first insulation layer on the first metal lines;

etching the first insulation layer to expose the first metal lines;

depositing a conductive material into the etched portion of the first insulation layer to form contact plugs;

forming a second insulation layer on the first insulation layer and the contact plugs etching the second insulation layer to expose the contact plugs;

depositing a material for cores into the etched portions of the second insulation layer to form the cores;

selectively removing the second insulation layer to expose the cores; and depositing second metal lines on both sides of the cores to branch current to both sides of the cores.

2. The method of claim 1, wherein the material for the cores is TaN or TiN.

3. The method of claim 1, wherein in forming the second insulation layer, a nitride layer is formed on the first insulation layer and the contact plugs prior to the formation of the second insulation layer, and in etching the second insulation layer, the second insulation layer and the nitride layer are sequentially etched to expose the contact plugs.

4. The method of claim 3, wherein the nitride layer is used for etch-stop.

* * * * *